(12) United States Patent
Arisawa et al.

(10) Patent No.: US 6,340,657 B1
(45) Date of Patent: Jan. 22, 2002

(54) METHOD FOR PRODUCING THIN FILMS OF RIBBON-LIKE OXIDE HIGH-TEMPERATURE SUPERCONDUCTOR

(75) Inventors: Shunichi Arisawa; Kazumasa Togano; Takeshi Hatano; Hanping Miao, all of Ibaraki (JP)

(73) Assignee: Japan as represented by Director General of National Research Institute for Metals, Ibaraki (JP)

( * ) Notice: Subject to any disclaimer, the term of this patent is extended or adjusted under 35 U.S.C. 154(b) by 0 days.

(21) Appl. No.: 09/513,194

(22) Filed: Feb. 25, 2000

(30) Foreign Application Priority Data

Feb. 25, 1999 (JP) .............................................. 11-049114

(51) Int. Cl.$^7$ ............................. H01L 39/24; B05D 5/12
(52) U.S. Cl. ......................... 505/452; 505/470; 427/62
(58) Field of Search ................................. 505/452, 450, 505/470; 427/62

(56) References Cited

PUBLICATIONS

Patel et al, "Processing of Bi2Sr2CaCu2Ox thick film from nitrate precusros", Applied Phys. Letters, 63 (18) Nov. 1993, pp. 2558–2560.*

Nagai et al., "Formation of the High Tc Phase in Pb–Free Bi–Sr–Ca–Cu–O Thin film", Japanese Journal of Applied Physics, vol. 30, No. 5A May 1991, pp. 826–829.*

Shimomura et al., "Preparation of Superconductive (Bi,Pb) Sr–Ca–Cu–O thick films by rapid quenching", Japanese journal of Applied Physics, vol. 28, No. 4, Apr. 1989, pp. 612–614.*

Spann et al., "Oriented BSCCO thick film coating on polycrystalline MgO", Journal Material Resource, vol. 5, No. 6, Jun. 1990, pp. 1163–1168.*

* cited by examiner

Primary Examiner—Brian K. Talbot
(74) Attorney, Agent, or Firm—Wenderoth, Lind & Ponack, L.L.P.

(57) ABSTRACT

A simple and low-cost method for producing a thin film of ribbon-like oxide high-temperature (high-Tc) superconductor, which comprises placing a solid starting material for the oxide high-temperature superconductor on a substrate and heating it at a temperature in the vicinity of the melting point of the solid starting material under ambient pressure in an oxygen atmosphere.

8 Claims, 2 Drawing Sheets

METHOD FOR PRODUCING THIN FILMS OF RIBBON-LIKE OXIDE HIGH-TEMPERATURE SUPERCONDUCTOR

TECHNICAL FIELD OF THE INVENTION

The invention of the present application relates to a method for producing a thin film of ribbon-like oxide high-temperature superconductor. In further detail, it relates to a method for producing thin film of ribbon-like oxide high-temperature (high-Tc) superconductor which can also be used as thin films of Bi-based oxide superconductors comprising a ribbon-like texture, useful for novel applications such as electronic devices.

BACKGROUND OF THE INVENTION

Thin films of Bi-based oxide superconductors has been produced heretofore by using vacuum evaporation techniques such as sputtering.

However, the conventionally used methods above found difficulties in producing large area products. Moreover, these film production processes using the vacuum technology suffer problems such as a low mass-productivity and an increase in production cost because of the long duration of time required for evacuation within a single batch. Furthermore, a large equipment installation is required in the use of vacuum technology, and a high cost of operating the entire installation is another problem.

SUMMARY OF THE INVENTION

In the light of the aforementioned circumstances, an object of the invention disclosed in the present application is to provide a novel method for producing superconducting thin films at a smaller initial cost and at a reduced running cost, which is yet capable of realizing high reproducibility and mass productivity.

As a means for achieving the object above, the invention disclosed in the present application provides a method for producing a thin film of ribbon-like oxide high-temperature superconductor, which comprises placing a solid starting material for the oxide high-temperature superconductor at a predetermined position of a substrate and heating it at a temperature in the vicinity of the melting point of the solid starting material under ambient pressure in an oxygen atmosphere.

The present invention also provides the method described above, wherein the thin film of the ribbon-like oxide high-temperature superconductor that is produced by the method comprises a texture in which extremely thin ribbon-like thin films cross each other; wherein a powder or a sintered pellet of Bi-based oxide superconductor $Bi_2Sr_2Ca_1Cu_2O_x$ is used as the solid starting material, and the heat treatment is performed in the temperature range of from 850 to 913° C.; wherein an amorphous material is used as the solid starting material, and the heat treatment is performed in the temperature range of from 800 to 890° C.; or wherein silver or a silver-based alloy is used for the substrate.

The invention according to the present application is described by referring to embodiments.

More specifically describing by way of an example, the invention according to the present application provides a production method capable of producing a unique oxide high Tc superconductor thin film having a texture as such that ribbon-like thin films cross each other, said method comprising placing a solid starting material for a Bi-based oxide superconductor on an edge of a substrate such as a silver substrate, etc., and performing a heat treatment in an oxygen atmosphere under ambient pressure by heating at a temperature of, for instance, 905° C., followed by isothermal heating at 860° C.

In the present case, the heat treatment is performed, for instance, in the vicinity of the melting point (860° C.).

The term "in the vicinity of" as referred herein is generally defined as a temperature range from 60° C. below to 60° C. over the melting point of the solid starting material.

Specifically, considering the case of the Bi-based solid starting material as above wherein the melting point is 860° C., the heat treatment is preferably performed in a temperature range of from 800 to 920° C.

A more preferred temperature range for the heat treatment can be set in accordance with the type and the composition of the solid starting material. In the case of using a powder or a sintered pellet corresponding to a Bi-2212 phase $(Bi_2Sr_2Ca_1Cu_2O_x)$ as the solid starting material, a temperature range of from 850 to 913° C. is preferred, whereas a heat treatment in the temperature range of from 800 to 890° C. is preferable for a case using an amorphous material for the solid starting material.

The consideration for the heat treatment in the vicinity of the melting point, which is performed in the temperature range of from 60° C. below to 60° C. above the melting point is not only applied to the $Bi-Sr-Ca-Cu-O_x$ system composition, but is generally applied to various types of Bi-based oxide superconductors such as the $Bi-Pb-Sr-Ca-Cu-O_x$ system. If the heat treatment should be performed at a temperature considerably higher than the melting point, the desired thin film would not be formed, but a thick film would result. If the temperature is too lower, ribbon-like crystals cannot be obtained.

The heat treatment is performed in an oxygen atmosphere under ambient pressure. A slightly reduced pressure state or a slightly pressurized state is also allowable to maintain the oxygen atmosphere. The oxygen atmosphere may be 100% gaseous $O_2$, or a mixed gas atmosphere containing gaseous $O_2$ at a partial pressure of 80% or higher accompanied by other inert gases such as gaseous $N_2$ or a rare gas. If the partial pressure of $O_2$ is less than 80%, it becomes difficult to obtain ribbon-like crystals.

Although there may be considered using various types of substrates, silver or a silver alloy can be exemplified as a representative material.

In accordance with the method of the present invention, a super thin film having unique texture can be produced on the substrate. Thus, a novel application such as an electronic device taking advantage of this particular texture can be considered.

The thin film provided by the method of the present invention can be characterized by a thin film consisting of fine ribbon-like oxide high Tc superconductors developed into a film-like shape. Furthermore, the ribbon-like oxide high Tc superconductors are extremely thin ribbon-like films, and a large number of these ribbon-like thin films cross each other as to form a texture as a whole. The ribbon-like oxide high Tc superconductors are presumably crystalline, consisting of single crystals, or principally containing single crystals.

Vacuum evaporation technology such as a sputtering process has been employed heretofore to produce the thin films of Bi-based oxide superconductors; however, the present invention enables the production of films under ambient pressure. Moreover, as compared with the vacuum technology which requires a large equipment installation, the only requirement in the present invention is an electric furnace. Thus, in practical application, the installation can be set up at an extremely low cost and yet, at a very simple structure and in a reduced floor area. This suppresses the operation cost to a low level.

Furthermore, in contrast to the case of vacuum evaporation which was found difficult to produce large area products, the method according to the present invention readily enables mass production by arranging a plurality of samples inside the furnace Further, as compared with the conventional filming methods using the vacuum technology, the mass productivity of the method according to the present invention is far improved because it provides thin films under ambient pressure and thereby eliminates the time necessary for vacuum evacuation.

DESCRIPTION OF THE PREFERRED EMBODIMENTS

The constitution of the present invention as well as the function and the effect thereof are described in further detail below by making reference to the Example below. It should be understood, however, that the present invention is by no way limited thereto.

EXAMPLE

A powder with a composition corresponding to Bi-2212 ($Bi_2Sr_2Ca_1Cu_2O_x$) was placed on the edge of a silver substrate, and was heated for 10 minutes at 905° C. in pure gaseous oxygen under ambient pressure, followed by isothermal heating at 860° C. for 6 hours. As a result, numerous ribbon-like structures were observed to generate.

Figure 1:
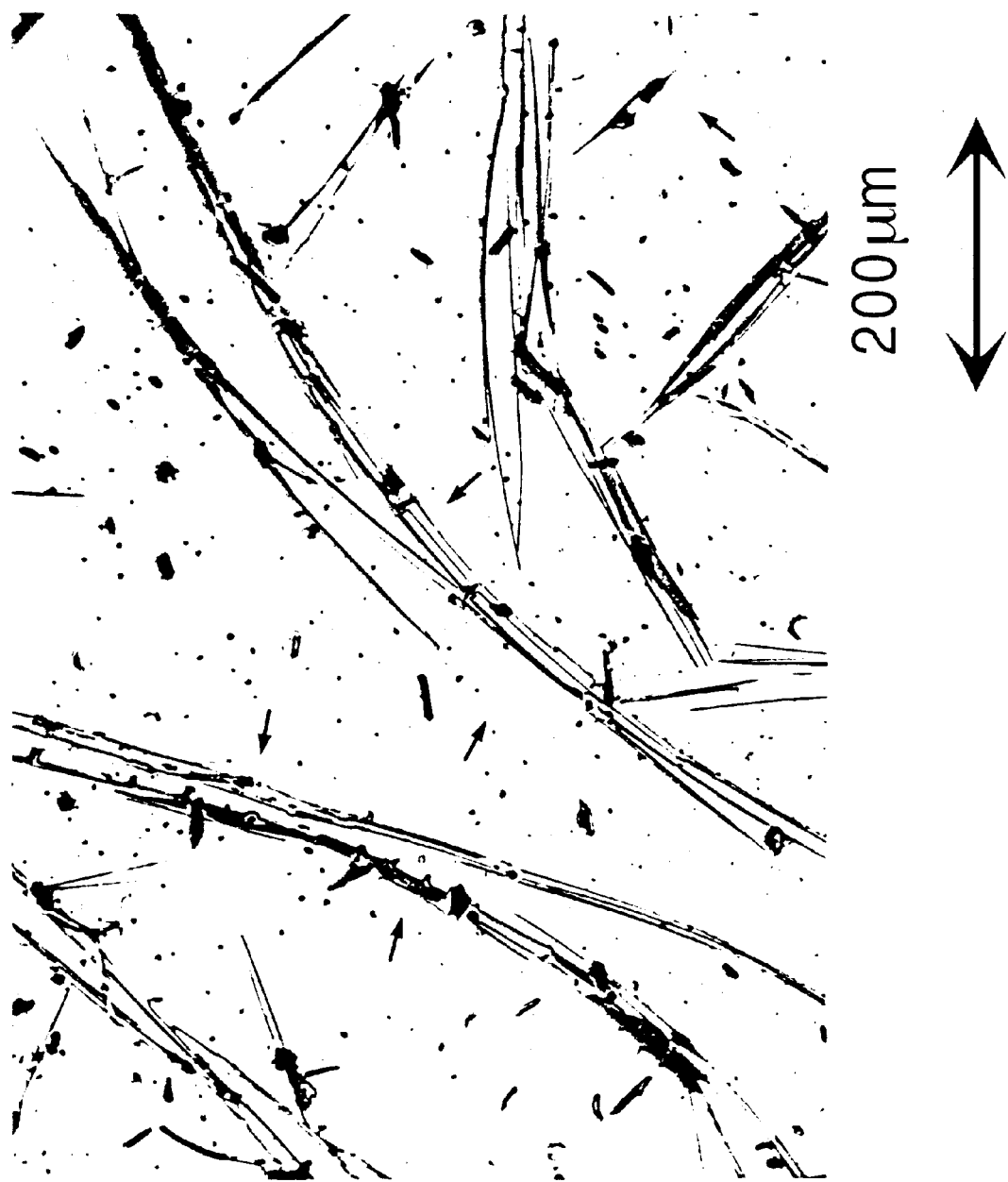
FIG. 1 is an optical micrograph showing a specimen produced in the Example.

The attached FIG. 1 shows the optical micrograph of the specimen produced in the present Example.

Referring to FIG. 1, it was confirmed by the observation under an optical microscope that the texture consists of ribbon-like structures each several hundreds of micrometers in length, several tens of micrometers in width, and less than a micrometer in thickness.

The structure of the specimen was analyzed by X ray diffraction analysis, and the presence of a Bi-2212 texture having approximately a c-axis crystallographic orientation was confirmed. From the fact that no crystallite size was observed under a scanning electron microscope or an optical microscope, and because the manner of crystal growth strongly suggests the formation of single crystals, the texture was presumed to consist of single crystals.

The superconductivity of the texture was evaluated by measuring the electric resistance using DC four-probe method, a sharp superconducting transition showing zero resistance was confirmed at ca. 75 K.

Figure 2:
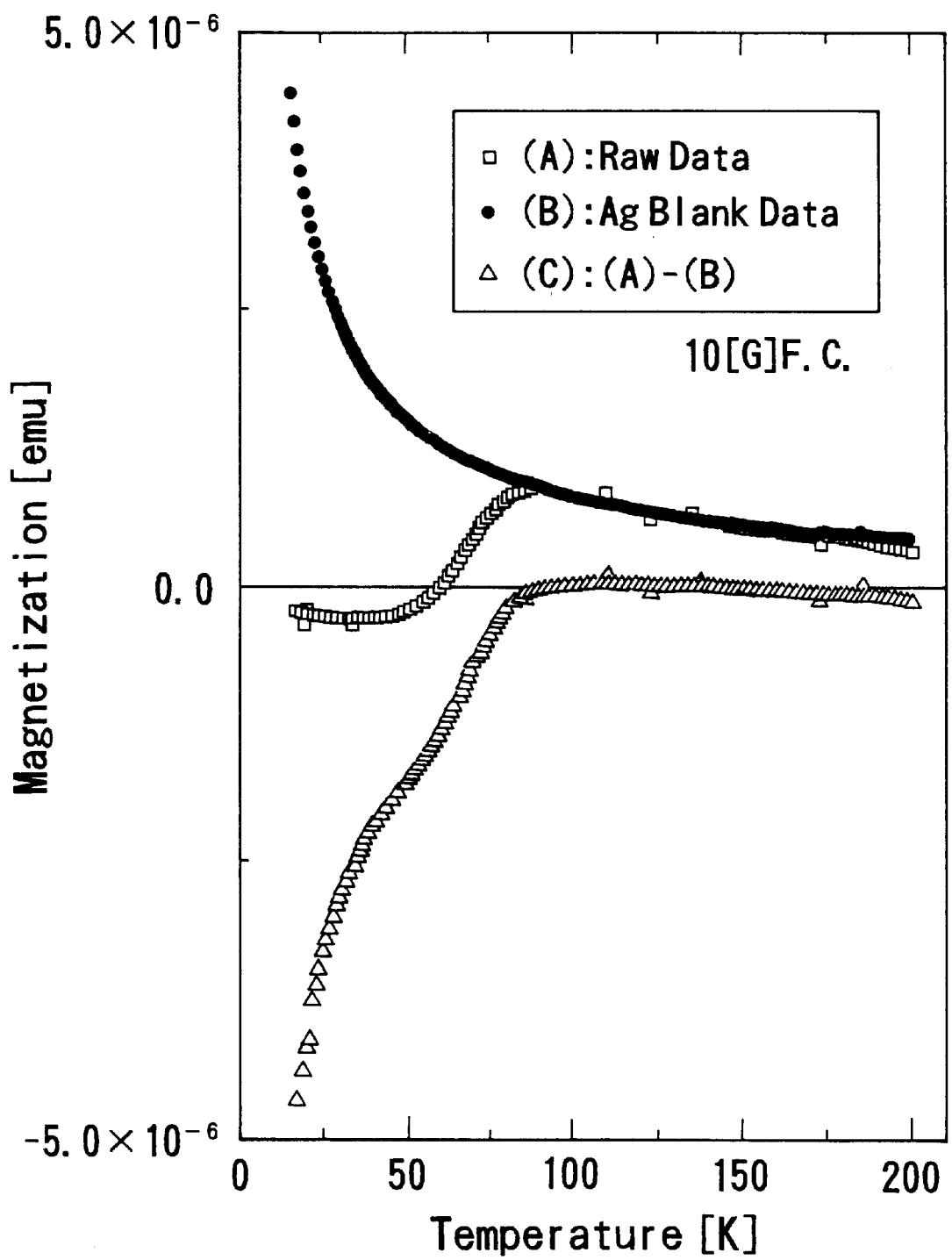
FIG. 2 is a diagram showing the relation between temperature and magnetization.

The attached FIG. 2 shows the change in magnetization with changing temperature, wherein (A) indicates directly observed numerical data plots, (B) indicates the blank data for the silver substrate, and (C) shows the net magnetization each obtained by subtracting the corresponding values of (B) from those of (A).

It can be seen from FIG. 2 that a superconducting transition is observed at a temperature over ca. 80 K.

As compared with the values of a thin film specimen prepared by a general vacuum process, those obtained above are extremely high, and suggest the generation of a film of very high quality.

As described above in detail, the invention according to the present application provides a method for producing a thin film of ribbon-like oxide high-Tc superconductor having a unique texture in which extremely thin ribbon-like thin films cross each other. thin film of ribbon-like oxide high-Tc superconductor having a unique texture in which extremely thin ribbon- or tape-like thin films cross each other.

As compared with a conventional vacuum process, the method of the present invention greatly reduces the total production cost, because it not only considerably lowers the initial cost and running cost, but also enables mass production of thin films.

While the invention has been described in detail by making reference to specific examples, it should be understood that various changes and modifications can be made without departing from the scope and the spirit of the present invention.

What is claimed is:

1. A method for producing a thin film of ribbon-like oxide high-temperature superconductor, which comprises placing a solid starting material for the oxide high-temperature superconductor on a substrate and heating it at a temperature in the range from 60 degrees below or above the melting point of the solid starting material under ambient pressure in an oxygen atmosphere containing gaseous $O_2$ at a partial pressure of 80% or higher.

2. A method for producing a thin film of ribbon-like oxide high-temperature superconductor as claimed in claim 1, wherein the thin film of the ribbon-like oxide high-temperature superconductor comprises a texture in which extremely thin ribbon-like thin films cross each other.

3. A method for producing a thin film of ribbon-like oxide high-temperature superconductor as claimed in claim 1 or 2, wherein a powder or a sintered pellet of Bi-based oxide superconductor $Bi_2Sr_2Ca_1Cu_2O_x$ is used as the solid starting material, and the heat treatment is performed in the temperature range of from 850 to 913° C.

4. A method for producing a thin film of ribbon-like oxide high-temperature superconductor as claimed in claim 1 or 2, wherein an amorphous material is used as the solid starting material, and the heat treatment is performed in the temperature range of from 800 to 890° C.

5. A method for producing a thin film of ribbon-like oxide high-temperature superconductor as claimed in claims 1 or 2, wherein silver or a silver-based alloy is used for the substrate.

6. A method for producing a thin film of ribbon-like oxide high-temperature superconductor as claimed in claim 3, wherein silver or a silver-based alloy is used for the substrate.

7. A method for producing a thin film of ribbon-like oxide high-temperature superconductor as claimed in claim 4, wherein silver or a silver-based alloy is used for the substrate.

8. A method for producing a thin film of ribbon-like oxide high-temperature superconductor according to claim 1, wherein the film has a thickness of less than one micrometer.

* * * * *